(12) United States Patent
Stainsby et al.

(10) Patent No.: US 11,428,764 B2
(45) Date of Patent: Aug. 30, 2022

(54) MAGNETIC RESONANCE IMAGING SYSTEM AND METHOD FOR RAPID SHUTDOWN AND RECHARGE OF A SUPERCONDUCTING MAGNET

(71) Applicant: Synaptive Medical Inc., Toronto (CA)

(72) Inventors: Jeff Alan Stainsby, Toronto (CA); Chad Tyler Harris, Toronto (CA); Alexander Gyles Panther, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 0 days.

(21) Appl. No.: 17/162,051

(22) Filed: Jan. 29, 2021

(65) Prior Publication Data

US 2022/0244331 A1    Aug. 4, 2022

(51) Int. Cl.
*G01R 33/3815* (2006.01)
*H01F 6/04* (2006.01)
*G01R 33/38* (2006.01)

(52) U.S. Cl.
CPC ..... *G01R 33/3815* (2013.01); *G01R 33/3804* (2013.01); *H01F 6/04* (2013.01)

(58) Field of Classification Search
CPC .... G01R 33/3815; G01R 33/3804; H01F 6/04
See application file for complete search history.

(56) References Cited

U.S. PATENT DOCUMENTS

| | | | |
|---|---|---|---|
| 6,598,404 B2 | 7/2003 | Kruip | |
| 7,701,677 B2 | 4/2010 | Schultz | |
| 8,699,199 B2 | 4/2014 | Blakes | |
| 9,638,774 B2 | 5/2017 | Pourrahimi | |

(Continued)

FOREIGN PATENT DOCUMENTS

| | | | |
|---|---|---|---|
| JP | H0884446 A | * | 3/1996 |
| WO | 2014049501 | | 4/2014 |

(Continued)

OTHER PUBLICATIONS

Tixador, Superconducting Magnetic Energy Storage: Status and Perspective, IEEE/CSC & ESAS European Superconductivity News Forum, No. 3, Jan. 2008 (Year: 2008).*

(Continued)

*Primary Examiner* — Daniel R Miller

(57) ABSTRACT

A magnetic resonance imaging (MRI) system includes a set of magnet coils for generating a magnetic field. The set of magnet coils are composed of a superconducting material. The system further includes a mechanical cryocooler in thermal contact with the set of magnet coils and operable to reduce and maintain a temperature of the set of magnet coils below a transition temperature of the superconducting material, and an energy storage device coupled to the set of magnet coils. The energy storage device may be capable of receiving and storing energy dissipated from the set of magnet coils during rapid shutdown of the set of magnet coils. The system may also include a controller coupled to the energy storage device. The controller may be programmed to recharge the set of magnet coils using the energy stored in the energy storage device during the rapid shutdown of the set of magnet coils.

5 Claims, 4 Drawing Sheets

(56) References Cited

U.S. PATENT DOCUMENTS

| | | | |
|---|---|---|---|
| 2011/0210739 A1* | 9/2011 | Ham | G01R 33/28 |
| | | | 324/318 |
| 2012/0182012 A1 | 7/2012 | Lvovsky et al. | |
| 2014/0085021 A1* | 3/2014 | Blakes | H01F 6/04 |
| | | | 335/216 |
| 2015/0323626 A1* | 11/2015 | Jonas | G01R 33/3804 |
| | | | 324/322 |
| 2017/0261574 A1* | 9/2017 | Stainsby | H01F 6/008 |
| 2020/0321847 A1* | 10/2020 | Wu | H01F 6/04 |

FOREIGN PATENT DOCUMENTS

| | | | |
|---|---|---|---|
| WO | 2016142747 A1 | 9/2016 | |
| WO | 2017064539 A1 | 4/2017 | |

OTHER PUBLICATIONS

Guo, X. L., et al. "The role of quench-back in the passive quench protection of uncoupled solenoids in series with and without coil sub-division." IEEE transactions on applied superconductivity 21.3 (2010): 2388-2393.

Search report issued by the Intellectual Property Office of the UK in relation to GB Application No. GB2201167.0 dated May 5, 2022, 1 pg.

* cited by examiner

MAGNETIC RESONANCE IMAGING SYSTEM AND METHOD FOR RAPID SHUTDOWN AND RECHARGE OF A SUPERCONDUCTING MAGNET

BACKGROUND

The field of the invention is systems and methods for magnetic resonance imaging ("MRI"). More particularly, the invention relates to systems and methods for MRI in which the magnetic field of the MRI scanner can be rapidly shutdown and recharged as needed.

MRI systems typically utilize one of two types of magnet assemblies to generate the strong, main magnetic field used for imaging. One type generates the main magnetic field using permanent magnets. This type of system is less popular because the magnetic field strengths that can be achieved with such systems is limited. Moreover, these systems tend to be extremely heavy and are very sensitive to temperature fluctuations. Permanent magnets also cannot be turned off, so there is no way to remove the magnetic field.

The second type of MRI system generates the main magnetic field using a superconducting electromagnet. Using superconducting magnets allows high current densities through the conductors of the electromagnet without power dissipation, which in turn enables the ability to achieve high magnetic field strengths. For the magnet to be superconducting, the magnet coils must be cooled to extremely low temperatures (e.g., about 4 K).

One method used to cool the superconducting magnet coils to this low temperature is done by immersing the conductor in a liquid helium bath. These superconducting systems tend to be very expensive because of the high cost of the liquid cryogens (e.g., liquid helium). Furthermore, it is not easy to rapidly turn on or off the magnetic fields generated by these systems. For example, to rapidly turn off the magnetic field (referred to herein as a "quench") typically requires heating up the conductive magnet coils so that they develop resistance that can dissipate their stored energy. This resistance produces heat that causes the liquid cryogen, which is providing the cooling, to convert to rapidly expanding gas. This boiling-off of the liquid cryogen removes the cooling capability of the system, and thus the magnetic field generated by the magnet coils. But, current cannot be restored in the magnetic coils and the magnet field cannot be regenerated until the liquid cryogen is replaced and the magnet coils are cooled back down to superconducting temperatures, a process that normally involves multiple days and significant expense. Furthermore, there is a risk of the superconducting magnet coils to be damaged during the rapid heat up or displaced from their ideal position. The consequences of damage to the magnet coils can be as extreme as needing to be completely replaced after a quench.

Alternatively, current can be removed or added to superconducting magnet systems very slowly without causing enough heating to boil off the liquid cryogen. In these situations, it takes many hours to completely add or remove the current, making rapid turning the magnetic field on or off (e.g., an emergency shutdown) in this manner not feasible.

For safety reasons, it would be beneficial for an MRI scanner to be capable of having the magnetic field rapidly turned off. For example, large metallic objects being attracted by the strong magnetic field is one of the primary risks associated with these devices. In cases requiring emergency personnel, that may, for example, require oxygen tanks, or, in situations where someone is physically "pinned" to the magnet by a large metallic object, the magnet must be turned off in a very fast manner. Traditional superconducting magnets have implemented a mechanism to rapidly turn off the magnetic field in an emergency situation by "quenching" the magnet in the manner described above, where all liquid cryogens are boiled off very rapidly. Quenching the magnet, however, requires a time consuming and expensive replacement of the liquid cryogens before the magnetic field can be reestablished.

SUMMARY OF THE DISCLOSURE

In accordance with an embodiment, a magnetic resonance imaging (MRI) system includes a set of magnet coils for generating a magnetic field. The set of magnet coils are composed of a superconducting material. The system further includes a mechanical cryocooler in thermal contact with the set of magnet coils and operable to reduce and maintain a temperature of the set of magnet coils below a transition temperature of the superconducting material and an energy storage device coupled to the set of magnet coils and configured to receive and store energy dissipated from the set of magnet coils during a rapid shutdown of the set of magnet coils.

In accordance with another embodiment, a method for rapid shutdown and recharging of a superconducting magnet includes dissipating energy from a set of magnet coils in the superconducting magnet into an energy storage device coupled to the set of magnet coils based on a rapid shutdown condition, storing the dissipated energy in the energy storage device, determining a status of the rapid shutdown condition, and recharging the set of magnet coils using the energy stored in the energy storage device based on the status of the rapid shutdown condition.

In accordance with another embodiment, a system for rapid shutdown and recharging of a superconducting magnet includes an energy storage device coupled to the superconducting magnet and configured to receive and store energy dissipated from the superconducting magnet based on a rapid shutdown condition, and a controller coupled to the energy storage device and programmed to recharge the superconducting magnet using the energy stored in the energy storage device.

BRIEF DESCRIPTION OF THE DRAWINGS

The present disclosure will hereafter be described with reference to the accompanying drawings, wherein like reference numerals denote like elements.

DETAILED DESCRIPTION

Figure 1:
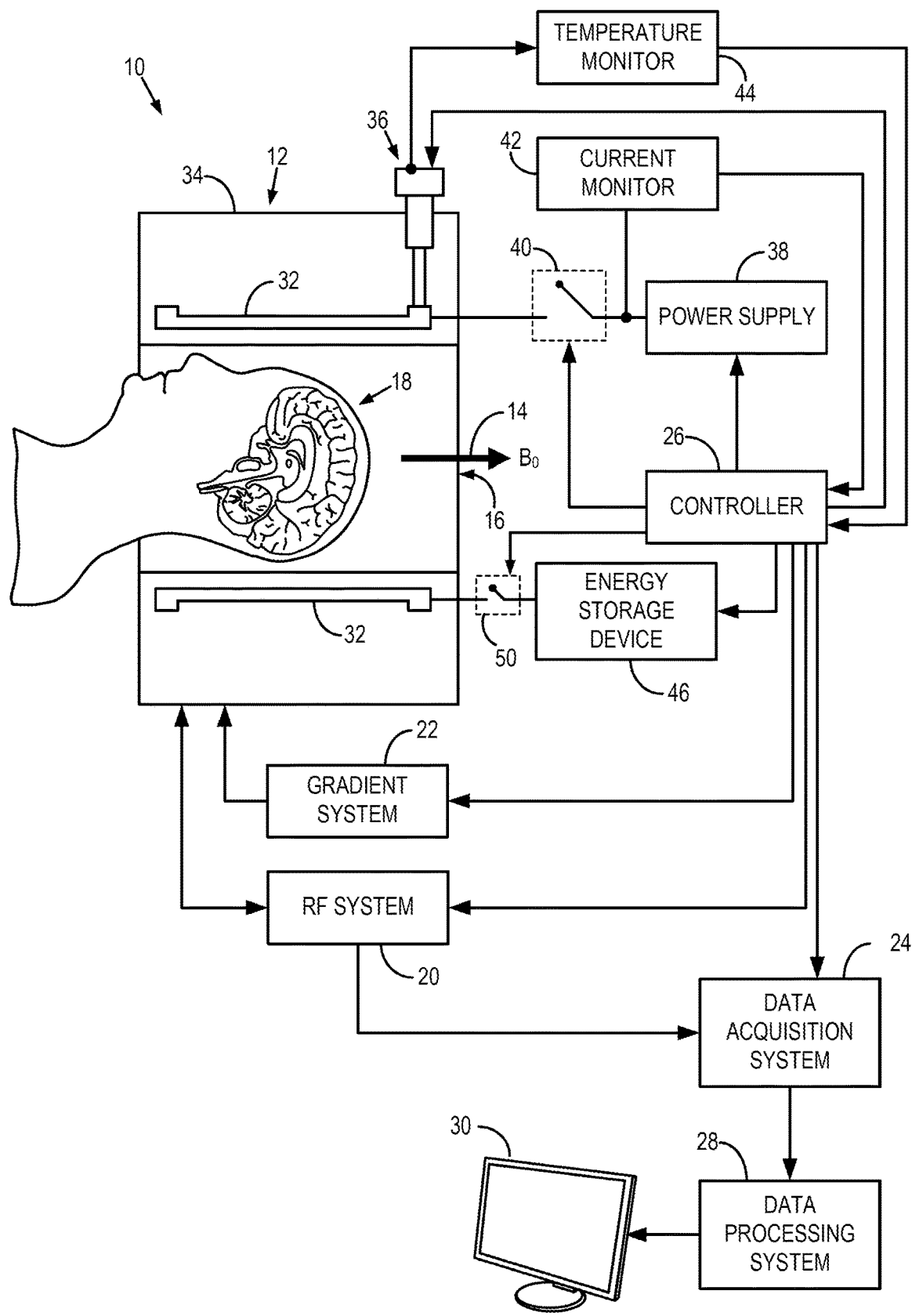
FIG. 1 is a block diagram of a magnetic resonance imaging ("MRI") system capable of rapid shutdown and recharge of a superconducting magnet in accordance with an embodiment.

The present disclosure describes systems and methods for rapid magnetic field shutdown and recharging in a magnetic resonance imaging ("MRI") system that includes a superconducting magnet cooled by a mechanical cryocooler.

Recently, there have been advances in superconductors and superconducting magnet design aimed at reducing the amount of expensive liquid cryogen required to achieve and maintain superconducting properties. These advances include the development of high temperature superconductors that are conductors that become superconducting at temperatures higher than 4 K. Currently, reasonable high temperature superconductors can operate at 10 K; although, some materials can demonstrate superconducting properties at temperatures as high as 30 K. Furthermore, there have been recent proposals on cryogen-free magnet designs that use a cryocooler to cool the magnet coil conductors through thermal contact rather than immersing the magnet coils within a liquid helium bath.

The systems and methods described here are based on such a cryogen free superconducting magnet design using traditional, or high temperature, superconductors where the main magnetic field can be turned off in a short amount of time. For instance, the magnetic field can be turned off in an amount of time comparable to a typical amount of time a traditional "quench" would take, e.g., less than 10 seconds.

The MRI system described here uses a mechanical cryocooler (or cold head) that is in thermal contact with the conductors in a superconducting magnet to cool them to temperatures approaching 4 K. Here, thermal contact can include direct or indirect contact, through which thermal energy can be transferred or conducted. The superconducting material used for the magnet design preferably maintains superconducting properties up to temperatures approaching 8 K. In the described system, current density can be removed from the conductive windings of the magnet coils in a rapid manner by introducing one or a combination of a power supply source, a resistive load and an external energy source. In one embodiment, a power supply source introduced into the circuit (e.g., by means of a superconducting switch) may be used to supply current to the magnet coils. Supplying current to the magnet coils introduces heat into the system, which can be removed using the thermal cooling capacity of the mechanical cryocooler (or cold head). In another embodiment, a resistive load with a large thermal mass may be introduced into the circuit (e.g., by means of a superconducting switch) and the majority of the energy stored in the superconducting magnet may be dissipated to this load rather than the magnet coils of the superconducting magnet during a rapid shutdown (or ramp down) to turn off the magnetic field. In yet another embodiment, an external energy storage device may be introduced into the circuit (e.g., by means of a superconducting switch) and may be used to store all, or part of the energy contained within the superconducting magnet coils that is dissipated during a rapid shutdown (or ramp down) to turn off the magnetic field. As mentioned, in other embodiments, combinations of the power supply source, resistive load and external energy storage device may be used for rapid shutdown. In addition, one or a combination of the power supply source, the resistive load and the external energy storage device may be used to recharge the magnet coils after a rapid shutdown.

In this system, the rate of energy exchange change (and thus the rate of magnetic field change) can be controlled so that the temperature of the conductor does not exceed a predetermined threshold that could potentially cause irreversible damage. For example, the predetermined threshold may be the superconducting transition point of the magnet coil material. In this manner, there is no rapid resistance changes in the conductor to cause an uncontrolled loss of magnetic field (i.e., a quench). In another example, the predetermined threshold may be a larger temperature than the superconducting transition point, for example, 20K, so long as the temperature a) doesn't cause significant damage to the wire or magnet structure; and b) doesn't require a significant amount of time to cool back down to superconducting temperature (~4-5K).

Referring now to FIG. 1, a magnetic resonance imaging system 10 generally includes a magnet assembly 12 for providing a magnetic field 14 that is substantially uniform within a bore 16 that may hold a subject 18 or other object to be imaged. The magnet assembly 12 supports a radio frequency ("RF") coil (not shown) that may provide an RF excitation to nuclear spins in the object or subject (not shown) positioned within the bore 16. The RF coil communicates with an RF system 20 producing the necessary electrical waveforms, as is understood in the art. The magnet assembly 12 also supports three axes of gradient coils (not shown) of a type known in the art, and which communicate with a corresponding gradient system 22 providing electrical power to the gradient coils to produce magnetic field gradients, $G_x$, $G_y$, and $G_z$ over time.

A data acquisition system 24 connects to RF reception coils (not shown) that are supported within the magnet assembly 12 or positioned within bore 16. The RF system 20, gradient system 22, and data acquisition system 24 each communicates with a controller 26 that generates pulse sequences that include RF pulses from the RF system 20 and gradient pulses from gradient system 22. The data acquisition system 24 receives magnetic resonance signals from the RF system 20 and provides the magnetic resonance signals to a data processing system 28, which operates to process the magnetic resonance signals and to reconstruct images therefrom. The reconstructed images can be provided to a display 30 for display to a user.

The magnet assembly 12 includes one or more magnet coils 32 housed in a vacuum housing 34, which generally provides a cryostat for the magnet coils 32, and mechanically cooled by a mechanical cryocooler 36, such as a Gifford-McMahon ("GM") cryocooler or a pulse tube cryocooler. In one example configuration, the cryocooler can be a Model RDK-305 Gifford-McMahon cryocooler manufactured by Sumitomo Heavy Industries (Japan). In general, the cryocooler 36 is in thermal contact with the magnet coils 32 and is operable to lower the temperature of the magnet coils 32 and to maintain the magnet coils 32 and a desired operating temperature. In some embodiments the cryocooler 36 includes a first stage in thermal contact with the vacuum housing 34 and a second stage in thermal contact with the magnet coils 32. In these embodiments, the first stage of the cryocooler 36 maintains the vacuum housing 34 at a first temperature and the second stage of the cryocooler 36 maintains the magnet coils 32 at a second temperature that is lower than the first temperature.

The magnet coils 32 are composed of a superconducting material and therefore provide a superconducting magnet. The superconducting material is preferably selected to be a material with a suitable critical temperature such that the magnet coils 32 are capable of achieving desired magnetic field strengths over a range of suitable temperatures. As one example, the superconducting material can be niobium ("Nb"), which has a transition temperature of about 9.2 K. As another example, the superconducting material can be niobium-titanium ("NbTi"), which has a transition temperature of about 10 K. As still another example, the superconducting material can be triniobium-tin ("Nb$_3$Sn"), which has a transition temperature of about 18.3 K.

The choice of superconducting material will define the range of magnetic field strengths achievable with the magnet assembly 12. Preferably, the superconducting material is chosen such that magnetic field strengths up to about 3.0 T can be achieved over a range of temperatures that can be suitably achieved by the cryocooler 36. In some configurations, however, the superconducting material can be chosen to provide magnetic field strengths higher than 3.0 T.

The cryocooler 36 is operable to maintain the magnet coils 32 at an operational temperature at which the magnet coils 32 are superconducting, such as a temperature that is below the transition, or critical, temperature for the material of which the magnet coils 32 are composed. As one example, a lower operational temperature limit can be about 4 K and an upper operational temperature limit can be at or near the transition, or critical, temperature of the superconducting material of which the magnet coils 32 are composed.

The current density in the magnet coils 32 in the MRI system 10 may be controllable to rapidly ramp up or ramp down the magnetic field 14 generated by the magnet assembly 12 while controlling the temperature of the magnet coils 32 with the cryocooler 36 to keep the temperature below the transition temperature of the superconducting material of which the magnet coils 32 are composed. As one example, the magnetic field 14 can be ramped up or ramped down on the order of minutes, such as fifteen minutes or less.

In general, the current density in the magnet coils 32 can be increased or decreased by connecting the magnet coils 32 to a circuit with a power supply 38 that is in electrical communication with the magnet coils 32 via a switch 40 and operating the power supply 38 to increase or decrease the current in the connected circuit. The switch 40 is generally a superconducting switch that is operable between a first, closed, state and a second, open, state.

When the switch 40 is in its open state, the magnet coils 32 are in a closed circuit, which is sometimes referred to as a "persistent mode." In this configuration, the magnet coils 32 are in a superconducting state so long as the temperature of the magnet coils 32 is maintained at a temperature at or below the transition temperature of the superconducting material of which they are composed.

When the switch 40 is in the closed state, however, the magnet coils 32 and the power supply 38 can be placed in a connected circuit, and the current supplied by the power supply 38 and the current in the magnet coils 32 will try to equalize. For instance, if the power supply 38 is operated to supply more current to the connected circuit, the current in the magnet coils 32 will increase, which will increase the strength of the magnetic field 14. On the other hand, if the power supply 38 is operated to decrease the current in the connected circuit, the current in the magnet coils 32 will decrease, which will decrease the strength of the magnetic field 14.

It will be appreciated by those skilled in the art that any suitable superconducting switch can be used for selectively connecting the magnet coils 32 and power supply 38 into a connected circuit; however, as one non-limiting example, the switch 40 may include a length of superconducting wire that is connected in parallel to the magnet coils 32 and the power supply 38. To operate such a switch 40 into its closed state, a heater in thermal contact with the switch 40 is operated to raise the temperature of the superconducting wire above its transition temperature, which in turn makes the wire highly resistive compared to the inductive impedance of the magnet coils 32. As a result, very little current will flow through the switch 40. The power supply 38 can then be placed into a connected circuit with the magnet coils 32. When in this connected circuit, the current in the power supply 38 and the magnet coils 32 will try to equalize; thus, by adjusting the current supplied by the power supply 38, the current density in the magnet coils 32 can be increased or decreased to respectively ramp up or ramp down the magnetic field 14. To operate the switch 40 into its open state, the superconducting wire in the switch 40 is cooled below its transition temperature, which places the magnet coils 32 back into a closed circuit, thereby disconnecting the power supply 38 and allowing all of the current to flow through the magnet coils 32.

When the magnet coils 32 are in the connected circuit with the power supply 38, the temperature of the magnet coils 32 will increase as the current in the connected circuit equalizes. Thus, the temperature of the magnet coils 32 should be monitored to ensure that the temperature of the magnet coils 32 remains below the transition temperature for the superconducting material of which they are composed. Because placing the magnet coils 32 into a connected circuit with the power supply 38 will tend to increase the temperature of the magnet coils 32, the rate at which the magnetic field 14 can be ramped up or ramped down will depend in part on the cooling capacity of the cryocooler 36. For instance, a cryocooler with a larger cooling capacity will be able to more rapidly remove heat from the magnet coils 32 while they are in a connected circuit with the power supply 38.

The power supply 38 and the switch 40 operate under control from the controller 26 to provide current to the magnet coils 32 when the power supply 38 is in a connected circuit with the magnet coils 32. A current monitor 42 measures the current flowing to the magnet coils 32 from the power supply 38, and a measure of the current can be provided to the controller 26 to control the ramping up or ramping down of the magnetic field 14. In some configurations, the current monitor 42 is integrated into the power supply 38.

A temperature monitor 44 is in thermal contact with the magnet assembly 12 and operates to measure a temperature of the magnet coils 32 in real-time. As one example, the temperature monitor 44 can include a thermocouple temperature sensor, a diode temperature sensor (e.g., a silicon diode or a GaAlAs diode), a resistance temperature detector ("RTD"), a capacitive temperature sensor, and so on. RTD-based temperature sensors can be composed of ceramic oxynitride, germanium, or ruthenium oxide. The temperature of the magnet coils 32 is monitored and can be provided to the controller 26 to control the ramping up or ramping down of the magnetic field 14.

In operation, the controller 26 is programmed to ramp up or ramp down the magnetic field 14 of the magnet assembly 12 in response to instructions from a user. As mentioned above, the magnetic field 14 can be ramped down by decreasing the current density in the magnet coils 32 by supplying current to the magnet coils 32 from the power supply 38 via the switch 40, which is controlled by the controller 26. Likewise, the strength of the magnetic field 14 can be ramped up by increasing the current density in the magnet coils 32 by supplying current to the magnet coils 32 from the power supply 38 via the switch 40, which is controlled by the controller 26.

The controller 26 is also programmed to monitor various operational parameter values associated with the MRI system 10 before, during, and after ramping the magnetic field 14 up or down. As one example, as mentioned above, the controller 26 can monitor the current supplied to the magnet coils 32 by the power supply 38 via data received from the current monitor 42. As another example, as mentioned above, the controller 26 can monitor the temperature of the magnet coils 32 via data received from the temperature monitor 44. As still another example, the controller 26 can monitor the strength of the magnetic field 14, such as by receiving data from a magnetic field sensor, such as a Hall probe or the like, positioned in or proximate to the bore 16 of the magnet assembly 12.

As mentioned above, certain conditions or situations may require that the magnetic field 14 of the magnet assembly 12 be shut down (or turned off) rapidly. For example, an emergency situation may be created by a large metallic object being attracted by the strong magnetic field of the magnet assembly 12. In one embodiment, the power supply source 38 may also be used to rapidly shutdown the magnetic field 14 of the magnet assembly 12 in response to a shutdown condition. As discussed above, the power supply source 38 may be connected to the magnet coils 32 and operated to remove or decrease the current in the magnet coils 32. The cryocooler 36 may be used to remove heat generated by the magnet coils 32 as the current in the magnet coils 32 decreases. In an embodiment, the temperature monitor 44 may be used to measure a temperature of the magnet coils 32 in real-time. The controller 26 may be configured to rapidly shutdown (or turn off) the magnet field 14 of the magnet assembly 12 in response to instructions from a user. The user may provide instructions to the controller based on the presence of a shutdown condition.

In another embodiment, a rapid shutdown (e.g., an emergency shutdown) of the magnet field of the magnet assembly 12 may be performed using an energy storage device 46 that is coupled to the magnet coils 32 and the controller 26. In one embodiment, the energy storage device may be an inductive load. For example, the inductive load may be a second superconducting system. The second superconducting system may be thermally coupled to the cryocooler 36 of MRI system 10 and cooled by the cryocooler 36. In another embodiment, the energy storage device 46 may be a battery. The energy storage device 46 may be coupled to the magnet coils 32 using a superconducting switch 50. The superconducting switch 50 may be controlled using, for example, controller 26 to selectively connect the energy storage device 46 and the magnet coils 32 into a connected circuit. In an embodiment, the superconducting switch 50 may be any suitable superconducting switch that can be used for selectively connecting the magnet coils 32 and energy storage device 46 into a connected circuit. For example, the superconducting switch 50 may be switched between an open state and a closed state as described in the non-limiting example mentioned above.

The energy storage device 46 may be used to store all, or a part of, the energy contained in the magnet coils 32 so that the current density is removed from the magnet coils 32 and the magnetic field 14 turned off. In other words, the energy from the magnet coils 32 may be dissipated into the energy storage device 46 during the rapid shutdown of the magnetic field 46. In an embodiment, the magnetic field 14 may be turned off in a short amount of time, for example, in an amount of time comparable to a typicality amount of time a transitional "quench" would take (e.g., less than 10 seconds). The controller 26 may be configured to rapidly shutdown (or turn off) the magnet field 14 of the magnet assembly 12 in response to instructions from a user. The user may provide instructions to the controller 26 based on the presence of a shutdown condition.

As mentioned above, the rate of energy exchange change (and thus the rate of magnetic field change) can be controlled so that the temperature of the conductor (magnet coils 32) does not exceed a predetermined threshold that could potentially cause irreversible damage. For example, the predetermined threshold may be the superconducting transition point of the magnet coil 32 material. In another example, the predetermined threshold may be a larger temperature than the superconducting transition point, for example, 20K. In an embodiment, the temperature monitor 44 may be used to measure a temperature of the magnet coils 32 in real-time. The temperature of the magnet coils 32 may be monitored and the temperature may be provided to the controller 26 to control the raid shutdown of the magnetic field 14.

After the magnetic field 14 has been shut down (or turned off), the condition(s) that led to the need for the rapid shutdown may be resolved. Once the rapid shutdown condition has been resolved, the energy stored in the energy storage device 46 from the shutdown of the magnetic field 14 may be used to fully, or partially, recharge the magnet coils 32. The controller 26 may be configured to recharge the magnet coils 32 using the energy stored in the energy storage device 46 from the shutdown of the magnetic field 14 in response to instructions from a user. For example, the energy storage device 46 and the superconducting switch 50 may operate under control from the controller 26 to provide the energy stored in the energy storage device 46 to the magnet coils 32 when the energy storage device 46 is in a connected circuit with the magnet coils 32.

Figure 2:
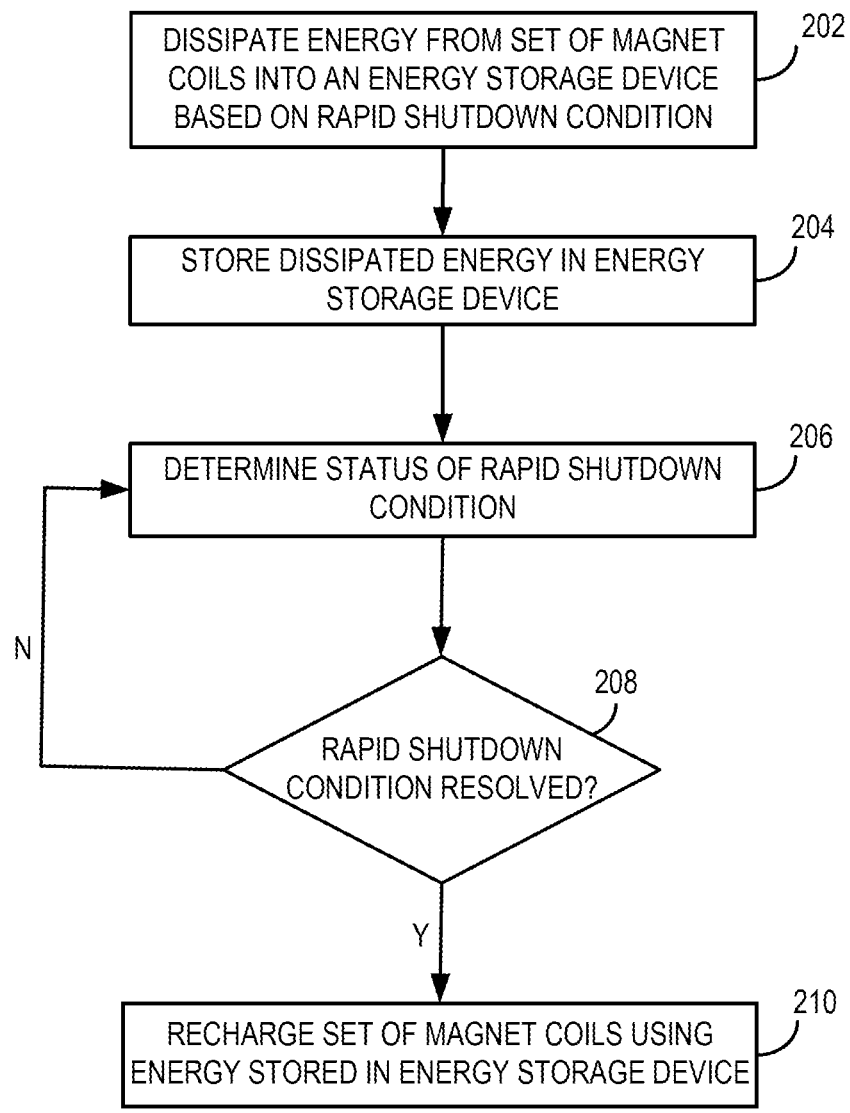
FIG. 2 illustrates a method for rapid shutdown and recharge of a superconducting magnet in accordance with an embodiment.

FIG. 2 illustrates a method for rapid shutdown and recharge of a superconducting magnet in accordance with an embodiment. At block 202, energy from a set of magnet coils in a magnet assembly of an MRI system is dissipated to an energy storage device coupled to the magnet coils. The energy is dissipated based on a rapid shutdown condition, for example, the presence of a large metallic object that is attracted by the strong magnetic field of the MRI system. In an embodiment, a user may provide instructions to the MRI system to rapidly shutdown the magnetic field of the magnet assembly. In one example, a superconducting switch may be used to connect the energy storage device to the magnet coils. During the shutdown of the magnetic field, current density is removed from the magnet coils and the energy is dissipated to the energy storage device. In an embodiment, the magnetic field may be turned off in a short amount of time, for example, in an amount of time comparable to a typicality amount of time a transitional "quench" would take (e.g., less than 10 seconds). As mentioned above, the rate of energy exchange change (and thus the rate of magnetic field change) can be controlled so that the temperature of the conductor does not exceed a predetermined threshold that could potentially cause irreversible damage. In an embodiment, a temperature monitor may be used to measure a temperature of the magnet coils in real-time. The temperature of the magnet coils may be monitored and the temperature may be provided to a controller of the MRI system to control the raid shutdown of the magnetic field 14.

At block 204, the energy dissipated from the magnet coils is stored in the energy storage device. The energy storage device may be, for example, an inductive load or a battery. After the magnetic field has been turned off, the status of the rapid shutdown condition is determined at block 206. If the rapid shutdown condition has not been resolved at block 208, the magnetic field will remain turned off until the issue is resolved. If the rapid shutdown condition has been resolved at block 208, the magnet coils of the magnet assembly may be recharged using the energy stored in the energy storage device at block 210. In an embodiment, a user may provide instructions to the MRI system to recharge of the magnet coils of the magnet assembly.

Figure 3:
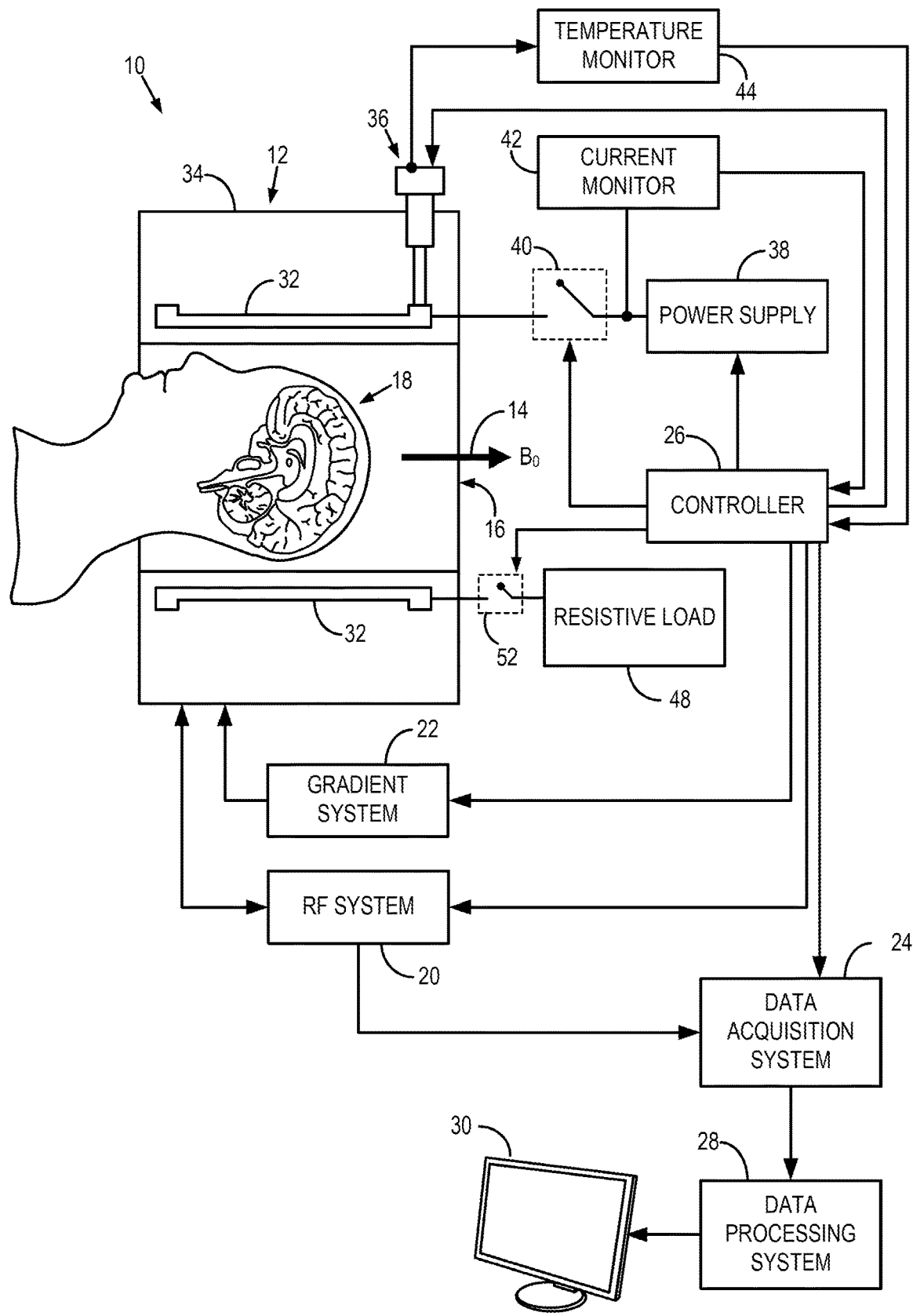
FIG. 3 is a block diagram of an MRI system capable of rapid shutdown of a superconducting magnet in accordance with an embodiment.

In another embodiment, a rapid shutdown (e.g., an emergency shutdown) of the magnet coils 32 may be performed using a resistive load coupled to the magnet coils 32. FIG. 3 is a block diagram of an MRI system capable of rapid shutdown of a superconducting magnet. The elements and operation of MRI system 10 shown in FIG. 3 are similar to the MRI system described above with respect to FIG. 1. In FIG. 3, the MRI system 10 includes a resistive load 48 is coupled to magnet coils 32 of a magnet assembly 12. In an embodiment, the resistive load 48 has a large thermal mass. The resistive load 48 may be coupled to the magnet coils 32 using a superconducting switch 52. The superconducting switch 52 may be controlled using, for example, controller 26 to selectively connect the resistive load 48 and the magnet coils 32 into a connected circuit. In an embodiment, the superconducting switch 52 may be any suitable superconducting switch that can be used for selectively connecting the magnet coils 32 and resistive load 48 into a connected circuit. For example, the superconducting switch 52 may be switched between an open state and a closed state as described in the non-limiting example mentioned above. Energy from the magnet coils 32 may be dissipated to the resistive load 48 during rapid shutdown of the magnetic field 14. In an embodiment, the magnetic field 14 may be turned off in a short amount of time, for example, in an amount of time comparable to a typicality amount of time a transitional "quench" would take (e.g., less than 10 seconds). As mentioned above, the rate of energy exchange change (and thus the rate of magnetic field change) can be controlled so that the temperature of the conductor (magnet coils 32) does not exceed a predetermined threshold that could potentially cause irreversible damage. In an embodiment, a temperature monitor 44 may be used to measure a temperature of the magnet coils 32 in real-time. The temperature of the magnet coils 32 may be monitored and the temperature may be provided to a controller 26 to control the rapid shutdown of the magnetic field 14. The controller 26 may be configured to rapidly shutdown (or turn off) the magnet field 14 of the magnet assembly 12 in response to instructions from a user. The user may provide instructions to the controller based on the presence of a shutdown condition.

Figure 4:
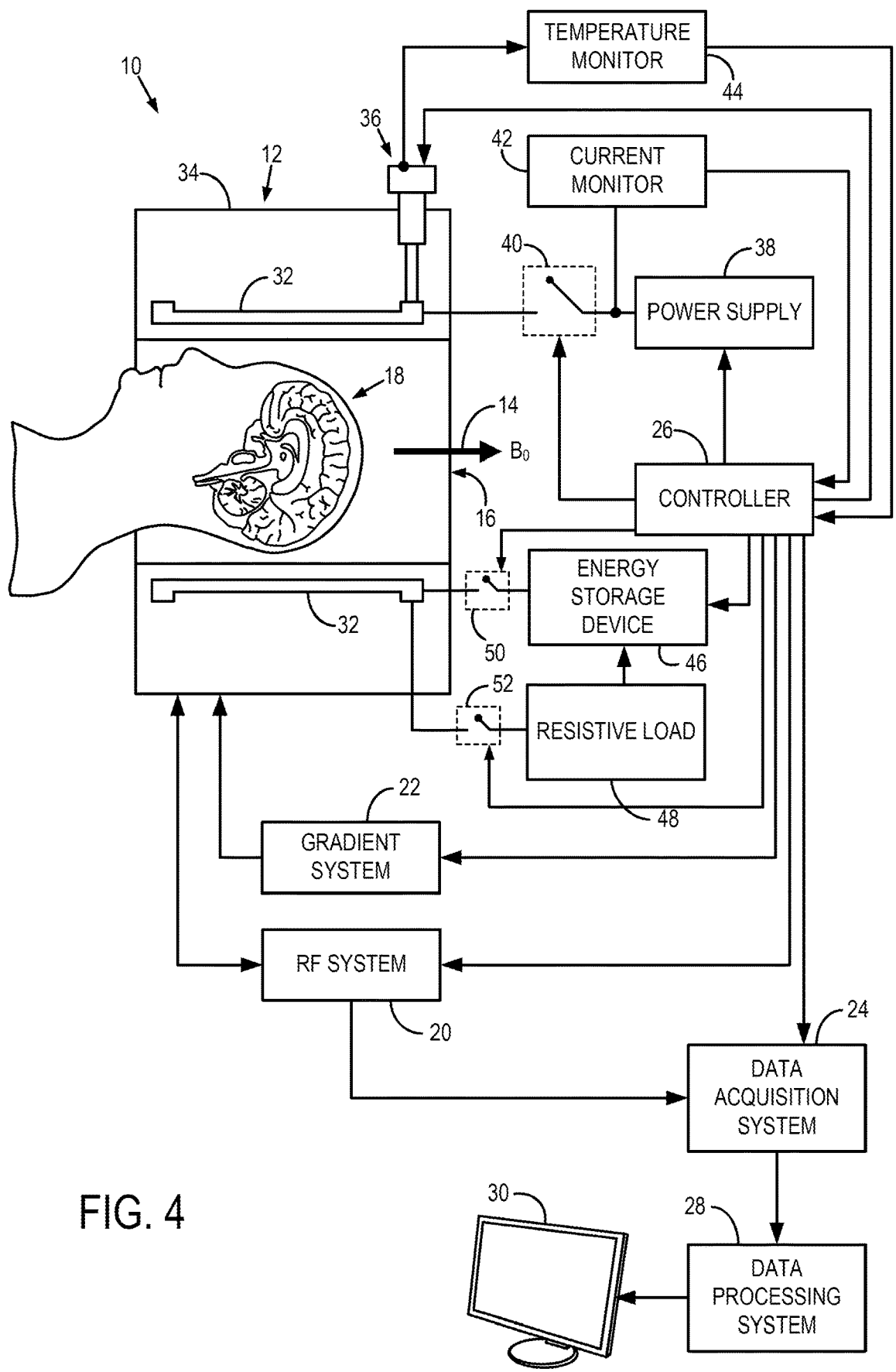
FIG. 4 is a block diagram of an MRI system capable of rapid shutdown and recharge of a superconducting magnet in accordance with an embodiment.

In yet another embodiment, a resistive load may be used in combination with an energy storage device to rapidly shutdown and recharge the magnet coils as shown in FIG. 4. The elements and operation of MRI system 10 shown in FIG. 4 are similar to the MRI system described above with respect to FIG. 1. In FIG. 4, the MRI system includes a resistive load 48 is coupled to magnet coils 32 of a magnet assembly 12 and the resistive load 48 is also coupled to an energy storage device 46. The energy storage device 46 is coupled to a controller 26. In one embodiment, the energy storage device may be an inductive load. For example, the inductive load may be a second superconducting system. The second superconducting system may be thermally coupled to the cryocooler 36 of MRI system 10 and cooled by the cryocooler 36. In another embodiment, the energy storage device 46 may be a battery. The energy storage device 46 may be coupled to the magnet coils 32 using a superconducting switch 50 and the resistive load 48 may be coupled to the magnet coils 32 using a superconducting switch 52. The superconducting switches 50, 52 may be controlled using, for example, controller 26 to selectively connect the energy storage device 46 and the resistive load 48, respectively, and the magnet coils 32 into a connected circuit. In an embodiment, the superconducting switches 50, 52 may be any suitable superconducting switch that can be used for selectively connecting the magnet coils 32 and resistive load 48 into a connected circuit. For example, the superconducting switches 50, 52 may be switched between an open state and a closed state as described in the non-limiting example mentioned above.

Energy from the magnet coils 32 may be dissipated to the resistive load 48 during rapid shutdown of the magnetic field 14. The controller 26 may be configured to rapidly shutdown (or turn off) the magnet field 14 of the magnet assembly 12 in response to instructions from a user. The user may provide instructions to the controller 26 based on the presence of a shutdown condition. Thermal energy (or heat) dissipated by the resistive load 48 may be used to charge the energy storage device 46. As mentioned above, the rate of energy exchange change (and thus the rate of magnetic field change) can be controlled so that the temperature of the conductor (magnet coils 32) does not exceed a predetermined threshold that could potentially cause irreversible damage. In an embodiment, a temperature monitor 44 may be used to measure a temperature of the magnet coils 32 in real-time. The temperature of the magnet coils 32 may be monitored and the temperature may be provided to a controller 26 to control the raid shutdown of the magnetic field 14.

After the magnetic field 14 has been shut down (or turned off), the condition(s) that led to the need for the rapid shutdown may be resolved. Once the rapid shutdown condition has been resolved, the energy stored in the energy storage device 46 from the resistive load 48 may be used to fully, or partially, recharge the magnet coils 32. The controller 26 may be configured to recharge the magnet coils 32 using the energy stored in the energy storage device 46 in response to instructions from a user. For example, the energy storage device 46 and the superconducting switch 50 may operate under control from the controller 26 to provide the energy stored in the energy storage device 46 to the magnet coils 32 when the energy storage device 46 is in a connected circuit with the magnet coils 32.

The present invention has been described in terms of one or more preferred embodiments, and it should be appreciated that many equivalents, alternatives, variations, and modifications, aside from those expressly stated, are possible and within the scope of the invention.

We claim:

1. A magnetic resonance imaging (MRI) system comprising:
   a set of magnet coils for generating a magnetic field, wherein the set of magnet coils are composed of a superconducting material;
   a mechanical cryocooler in thermal contact with the set of magnet coils and operable to reduce and maintain a temperature of the set of magnet coils below a transition temperature of the superconducting material; and
   an energy storage device coupled to the set of magnet coils and configured to receive and store energy dissipated from the set of magnet coils during a rapid shutdown of the set of magnet coils;
   wherein the energy storage device is an inductive load and the inductive load is a superconducting system; and
   wherein the superconducting system is thermally coupled to the mechanical cryocooler and the mechanical cryocooler is configured to reduce and maintain a temperature of the superconducting system.

2. The system according to claim 1, further comprising a controller coupled to the energy storage device and programmed to recharge the set of magnet coils using the energy stored in the energy storage device during the rapid shutdown of the set of magnet coils.

3. The system according to claim 2, wherein the controller is further programmed to control a rate of energy exchange between the energy storage device and the set of magnet coils.

4. The system according to claim 3, wherein the controller is further programmed to control the rate of energy exchange between the energy storage device and the set of magnet coils based on a predetermined threshold for a temperature of the set of magnet coils.

5. The system according to claim 2, further comprising a resistive load coupled to the set of magnet coils and the energy storage device, the resistive load configured to receive energy dissipated from the set of magnet coils during a rapid shutdown of the set of magnet coils and the energy storage device is further configured to be charged using thermal energy dissipated from the resistive load.

* * * * *